(12) United States Patent
Tucker et al.

(10) Patent No.: US 8,362,838 B2
(45) Date of Patent: Jan. 29, 2013

(54) MULTI-STAGE AMPLIFIER WITH MULTIPLE SETS OF FIXED AND VARIABLE VOLTAGE RAILS

(75) Inventors: John C. Tucker, Austin, TX (US); Ammisetti V. Prasad, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 1027 days.

(21) Appl. No.: 11/694,348

(22) Filed: Mar. 30, 2007

(65) Prior Publication Data

US 2008/0174372 A1    Jul. 24, 2008

Related U.S. Application Data

(60) Provisional application No. 60/885,673, filed on Jan. 19, 2007.

(51) Int. Cl.
*H03F 3/217* (2006.01)

(52) U.S. Cl. .................. 330/297; 330/310; 330/311

(58) Field of Classification Search .............. 330/297, 330/310, 311
See application file for complete search history.

(56) References Cited

U.S. PATENT DOCUMENTS

| | | | |
|---|---|---|---|
| 4,414,493 A | 11/1983 | Henrich | |
| 4,677,366 A | 6/1987 | Wilkinson et al. | |
| 4,721,919 A | 1/1988 | LaRosa et al. | |
| 4,786,880 A * | 11/1988 | Voorman | 330/294 |
| 4,797,633 A | 1/1989 | Humphrey | |
| 4,940,929 A | 7/1990 | Williams | |
| 4,973,919 A | 11/1990 | Allfather | |
| 5,200,711 A | 4/1993 | Andersson | |
| 5,278,490 A | 1/1994 | Smedley | |
| 5,323,157 A | 6/1994 | Ledzius et al. | |
| 5,359,180 A | 10/1994 | Park et al. | |
| 5,477,481 A | 12/1995 | Kerth | |
| 5,481,178 A | 1/1996 | Wilcox et al. | |
| 5,565,761 A | 10/1996 | Hwang | |
| 5,747,977 A | 5/1998 | Hwang | |
| 5,777,519 A | 7/1998 | Simopoulos | |

(Continued)

FOREIGN PATENT DOCUMENTS

| | | |
|---|---|---|
| EP | 1014563 | 6/2000 |
| EP | 1164819 A | 12/2001 |

(Continued)

OTHER PUBLICATIONS

Jones, "Multistage Amplifiers" Harvard University, EE 105 Week 13, Lecture 31, Spring 2000.*

(Continued)

*Primary Examiner* — Michael Shingleton
(74) *Attorney, Agent, or Firm* — Hamilton & Terrile, LLP; Kent B. Chambers

(57) ABSTRACT

A signal processing system and method utilizes a multi-stage amplifier to amplify an input signal. The multi-stage amplifier uses a mixed set of voltage rails to improve the operating efficiency of at least one of the amplification stages while allowing other amplification stages to operate in a predetermined operating mode. Efficiency of at least one of the stages is improved by supplying at least one variable voltage rail to an amplification stage of the multi-stage amplifier. The variable voltage rail varies in response to changes in an input signal voltage to the amplification stage. Accordingly, at least one amplification stage utilizes a variable voltage rail, and all amplification stages are supplied with a set of voltage rails that provides sufficient input signal headroom, thus, providing amplification stage efficiency and adequate voltage to allow operation of all amplification stages.

24 Claims, 5 Drawing Sheets

U.S. PATENT DOCUMENTS

| | | | |
|---|---|---|---|
| 5,783,909 A | 7/1998 | Hochstein | |
| 5,825,248 A | 10/1998 | Ozawa | |
| 5,963,086 A | 10/1999 | Hall | |
| 5,994,885 A | 11/1999 | Wilcox et al. | |
| 6,016,038 A | 1/2000 | Mueller et al. | |
| 6,043,633 A | 3/2000 | Lev et al. | |
| 6,072,969 A | 6/2000 | Yokomori et al. | |
| 6,083,276 A | 7/2000 | Davidson et al. | |
| 6,084,450 A | 7/2000 | Smith et al. | |
| 6,150,774 A | 11/2000 | Mueller et al. | |
| 6,211,626 B1 | 4/2001 | Lys et al. | |
| 6,211,627 B1 | 4/2001 | Callahan | |
| 6,229,271 B1 | 5/2001 | Liu | |
| 6,246,183 B1 | 6/2001 | Buonavita | |
| 6,259,614 B1 | 7/2001 | Ribarich et al. | |
| 6,304,066 B1 | 10/2001 | Wilcox et al. | |
| 6,304,473 B1 | 10/2001 | Telefus et al. | |
| 6,344,811 B1 | 2/2002 | Melanson | |
| 6,445,600 B2 | 9/2002 | Ben-Yaakov | |
| 6,509,913 B2 | 1/2003 | Martin, Jr. et al. | |
| 6,580,258 B2 | 6/2003 | Wilcox et al. | |
| 6,583,550 B2 | 6/2003 | Iwasa et al. | |
| 6,636,003 B2 | 10/2003 | Rahm et al. | |
| 6,713,974 B2 | 3/2004 | Patchornik et al. | |
| 6,727,832 B1 | 4/2004 | Melanson | |
| 6,741,123 B1 | 5/2004 | Melanson et al. | |
| 6,781,351 B2 | 8/2004 | Mednik et al. | |
| 6,788,011 B2 | 9/2004 | Mueller et al. | |
| 6,806,659 B1 | 10/2004 | Mueller et al. | |
| 6,860,628 B2 | 3/2005 | Robertson et al. | |
| 6,870,325 B2 | 3/2005 | Bushell et al. | |
| 6,882,552 B2 | 4/2005 | Telefus et al. | |
| 6,888,322 B2 | 5/2005 | Dowling et al. | |
| 6,940,733 B2 | 9/2005 | Schie et al. | |
| 6,944,034 B1 | 9/2005 | Shytenberg et al. | |
| 6,956,750 B1 | 10/2005 | Eason et al. | |
| 6,967,448 B2 | 11/2005 | Morgan et al. | |
| 6,970,503 B1 | 11/2005 | Kalb | |
| 6,975,079 B2 | 12/2005 | Lys et al. | |
| 7,064,498 B2 | 6/2006 | Dowling et al. | |
| 7,088,059 B2 | 8/2006 | McKinney et al. | |
| 7,102,902 B1 | 9/2006 | Brown et al. | |
| 7,109,791 B1 | 9/2006 | Epperson et al. | |
| 7,135,824 B2 | 11/2006 | Lys et al. | |
| 7,145,295 B1 | 12/2006 | Lee et al. | |
| 7,161,816 B2 | 1/2007 | Shytenberg et al. | |
| 7,183,957 B1 | 2/2007 | Melanson | |
| 7,221,130 B2 | 5/2007 | Ribeiro et al. | |
| 7,255,457 B2 | 8/2007 | Ducharm et al. | |
| 7,266,001 B1 | 9/2007 | Notohamiprodjo et al. | |
| 7,292,013 B1 | 11/2007 | Chen et al. | |
| 2002/0145041 A1 | 10/2002 | Muthu et al. | |
| 2002/0166073 A1 | 11/2002 | Nguyen et al. | |
| 2003/0058039 A1* | 3/2003 | Noro | 330/10 |
| 2003/0223255 A1 | 12/2003 | Ben-Yaakov | |
| 2004/0085030 A1 | 5/2004 | Laflamme et al. | |
| 2004/0085117 A1 | 5/2004 | Melbert et al. | |
| 2004/0169477 A1 | 9/2004 | Yancie et al. | |
| 2004/0227571 A1 | 11/2004 | Kuribayashi | |
| 2004/0228116 A1 | 11/2004 | Miller et al. | |
| 2004/0239262 A1 | 12/2004 | Ido et al. | |
| 2005/0110574 A1* | 5/2005 | Richard et al. | 330/297 |
| 2005/0156770 A1 | 7/2005 | Melanson | |
| 2005/0184895 A1 | 8/2005 | Petersen et al. | |
| 2005/0253533 A1 | 11/2005 | Lys et al. | |
| 2005/0275354 A1 | 12/2005 | Hausman, Jr. et al. | |
| 2006/0022916 A1 | 2/2006 | Aiello | |
| 2006/0023002 A1 | 2/2006 | Hara et al. | |
| 2006/0066411 A1* | 3/2006 | Sim | 330/302 |
| 2006/0125420 A1 | 6/2006 | Boone et al. | |
| 2006/0159292 A1* | 7/2006 | Guilbert | 381/120 |
| 2006/0226795 A1 | 10/2006 | Walter et al. | |
| 2006/0261754 A1 | 11/2006 | Lee | |
| 2007/0029946 A1 | 2/2007 | Yu et al. | |
| 2007/0040512 A1 | 2/2007 | Jungwirth et al. | |
| 2007/0053182 A1 | 3/2007 | Robertson | |
| 2007/0182490 A1* | 8/2007 | Hau et al. | 330/297 |
| 2007/0182699 A1 | 8/2007 | Ha et al. | |
| 2008/0044041 A1 | 2/2008 | Tucker et al. | |
| 2008/0144861 A1 | 6/2008 | Melanson et al. | |

FOREIGN PATENT DOCUMENTS

| | | |
|---|---|---|
| EP | 1213823 A2 | 6/2002 |
| EP | 1528785 A | 5/2005 |
| GB | 2043382 A | 10/1980 |
| WO | 01/97384 A | 12/2001 |
| WO | 0227944 | 4/2002 |
| WO | 02/091805 A2 | 11/2002 |
| WO | 2006/067521 A | 6/2006 |
| WO | WO2006135584 | 12/2006 |
| WO | 2007/026170 A | 3/2007 |
| WO | 2007/079362 A | 7/2007 |

OTHER PUBLICATIONS

"HV9931 Unity Power Factor LED Lamp Driver, Initial Release" 2005, Supertex Inc., Sunnyvale, CA USA.

AN-H54 Application Note: "HV9931 Unity Power Factor LED Lamp Driver" Mar. 7, 2007, Supertex Inc., Sunnyvale, CA, USA.

Dustin Rand et al: "Issues, Models and Solutions for Triac Modulated Phase Dimming of LED Lamps" Power Electronics Specialists Conference, 2007. PESC 2007, IEEE, IEEE, P1, Jun. 1, 2007, pp. 1398-1404.

Spiazzi G et al: "Analysis of a High-Power-Factor Electronic Ballast for High Brightness Light Emitting Diodes" Power Electronics Specialists, 2005 IEEE 36TH Conference on Jun. 12, 2005, Piscatawa, NJ USA, IEEE, Jun. 12, 2005, pp. 1494-1499.

International Search Report PCT/US2008/062381 dated Feb. 5, 2008.

International Search Report PCT/US2008/056739 dated Dec. 3, 2008.

Written Opinion of the International Searching Authority PCT/US2008/062381 dated Feb. 5, 2008.

Ben-Yaakov et al, "The Dynamics of a PWM Boost Converter with Resistive Input" IEEE Transactions on Industrial Electronics, IEEE Service Center, Piscataway, NJ, USA, vol. 46, No. 3, Jun. 1, 1999.

International Search Report PCT/US2008/062398 dated Feb. 5, 2008.

Partial International Search PCT/US2008/062387 dated Feb. 5, 2008.

Noon, Jim "UC3855A/B High Performance Power Factor Preregulator", Texas Instruments, SLUA146A, May 1996, Revised Apr. 2004.

"High Performance Power Factor Preregulator", Unitrode Products from Texas Instruments, SLUS382B, Jun. 1998, Revised Oct. 2005.

International Search Report PCT/GB2006/003259 dated Jan. 12, 2007.

Written Opinion of the International Searching Authority PCT/US2008/056739.

International Search Report PCT/US2008/056606 dated Dec. 3, 2008.

Written Opinion of the International Searching Authority PCT/US2008/056606 dated Dec. 3, 2008.

International Search Report PCT/US2008/056608 dated Dec. 3, 2008.

Written Opinion of the International Searching Authority PCT/US2008/056608 dated Dec. 3, 2008.

International Search Report PCT/GB2005/050228 dated Mar. 14, 2006.

International Search PCT/US2008/062387 dated Jan. 10, 2008.

Data Sheet LT3496 Triple Output LED Driver, 2007, Linear Technology Corporation, Milpitas, CA.

News Release, Triple Output LED, LT3496.

Freescale Semiconductor, Inc., Dimmable Light Ballast with Power Factor Correction, Design Reference Manual, DRM067, Rev. 1, Dec. 2005.

J. Zhou et al., Novel Sampling Algorithm for DSP Controlled 2 kW PFC Converter, IEEE Transactions on Power Electronics, vol. 16, No. 2, Mar. 2001.

A. Prodic, Compensator Design and Stability Assessment for Fast Voltage Loops of Power Factor Correction Rectifiers, IEEE Transactions on Power Electronics, vol. 22, No. 5, Sep. 2007.

M. Brkovic et al., "Automatic Current Shaper with Fast Output Regulation and Soft-Switching," S.15.C Power Converters, Telecommunications Energy Conference, 1993.

Dallas Semiconductor, Maxim, "Charge-Pump and Step-Up DC-DC Converter Solutions for Powering White LEDs in Series or Parallel Connections," Apr. 23, 2002.

Freescale Semiconductor, AN3052, Implementing PFC Average Current Mode Control Using the MC9S12E128, Nov. 2005.

D. Maksimovic et al., "Switching Converters with Wide DC Conversion Range," Institute of Electrical and Electronic Engineer's (IEEE) Transactions on Power Electronics, Jan. 1991.

V. Nguyen et al., "Tracking Control of Buck Converter Using Sliding-Mode with Adaptive Hysteresis," Power Electronics Specialists Conference, 1995. PESC apos; 95 Record., 26th Annual IEEE vol. 2, Issue , Jun. 18-22, 1995 pp. 1086-1093.

S. Zhou et al., "A High Efficiency, Soft Switching DC-DC Converter with Adaptive Current-Ripple Control for Portable Applications," IEEE Transactions on Circuits and Systems—II: Express Briefs, vol. 53, No. 4, Apr. 2006.

K. Leung et al., "Use of State Trajectory Prediction in Hysteresis Control for Achieving Fast Transient Response of the Buck Converter," Circuits and Systems, 2003. ISCAS apos;03. Proceedings of the 2003 International Symposium, vol. 3, Issue , May 25-28, 2003 pp. III-439-III-442 vol. 3.

K. Leung et al., "Dynamic Hysteresis Band Control of the Buck Converter with Fast Transient Response," IEEE Transactions on Circuits and Systems—II: Express Briefs, vol. 52, No. 7, Jul. 2005.

Y. Ohno, Spectral Design Considerations for White LED Color Rendering, Final Manuscript, Optical Engineering, vol. 44, 111302 (2005).

S. Skogstad et al., A Proposed Stability Characterization and Verification Method for High-Order Single-Bit Delta-Sigma Modulators, Norchip Conference, Nov. 2006 http://folk.uio.no/savskogs/pub/A_Proposed_Stability_Characterization.pdf.

J. Turchi, Four Key Steps to Design a Continuous Conduction Mode PFC Stage Using the NCP1653, ON Semiconductor, Publication Order No. AND184/D, Nov. 2004.

Megaman, D or S Dimming ESL, Product News, Mar. 15, 2007.

J. Qian et al., New Charge Pump Power-Factor-Correction Electronic Ballast with a Wide Range of Line Input Voltage, IEEE Transactions on Power Electronics, vol. 14, No. 1, Jan. 1999.

P. Green, A Ballast that can be Dimmed from a Domestic (Phase-Cut) Dimmer, IRPLCFL3 rev. b, International Rectifier, http://www.irf.com/technical-info/refdesigns/cfl-3.pdf, printed Mar. 24, 2007.

J. Qian et al., Charge Pump Power-Factor-Correction Technologies Part II: Ballast Applications, IEEE Transactions on Power Electronics, vol. 15, No. 1, Jan. 2000.

Chromacity Shifts in High-Power White LED Systems due to Different Dimming Methods, Solid-State Lighting, http://www.lrc.rpi.edu/programs/solidstate/completedProjects.asp?ID=76, printed May 3, 2007.

S. Chan et al., Design and Implementation of Dimmable Electronic Ballast Based on Integrated Inductor, IEEE Transactions on Power Electronics, vol. 22, No. 1, Jan. 2007.

M. Madigan et al., Integrated High-Quality Rectifier-Regulators, IEEE Transactions on Industrial Electronics, vol. 46, No. 4, Aug. 1999.

T. Wu et al., Single-Stage Electronic Ballast with Dimming Feature and Unity Power Factor, IEEE Transactions on Power Electronics, vol. 13, No. 3, May 1998.

F. Tao et al., "Single-Stage Power-Factor-Correction Electronic Ballast with a Wide Continuous Dimming Control for Fluorescent Lamps," IEEE Power Electronics Specialists Conference, vol. 2, 2001.

Azoteq, IQS17 Family, IQ Switch®—ProxSense™ Series, Touch Sensor, Load Control and User Interface, IQS17 Datasheet V2.00.doc, Jan. 2007.

C. Dilouie, Introducing the LED Driver, EC&M, Sep. 2004.

S. Lee et al., TRIAC Dimmable Ballast with Power Equalization, IEEE Transactions on Power Electronics, vol. 20, No. 6, Nov. 2005.

L. Gonthier et al., EN55015 Compliant 500W Dimmer with Low-Losses Symmetrical Switches, 2005 European Conference on Power Electronics and Applications, Sep. 2005.

Why Different Dimming Ranges? The Difference Between Measured and Perceived Light, http://www.lutron.com/ballast/pdf/LutronBallastpg3.pdf.

D. Hausman, Real-Time Illumination Stability Systems for Trailing-Edge (Reverse Phase Control) Dimmers, Technical White Paper, Lutron, version 1.0, Dec. 2004, http://www.lutron.com/technical_info/pdf/RTISS-TE.pdf.

Light Dimmer Circuits, www.epanorama.net/documents/lights/lightdimmer.html, printed Mar. 26, 2007.

Light Emitting Diode, http://en.wikipedia.org/wiki/Light-emitting_diode, printed Mar. 27, 2007.

Color Temperature, www.sizes.com/units/color_temperature.htm, printed Mar. 27, 2007.

S. Lee et al., A Novel Electrode Power Profiler for Dimmable Ballasts Using DC Link Voltage and Switching Frequency Controls, IEEE Transactions on Power Electronics, vol. 19, No. 3, May 2004.

Y. Ji et al., Compatibility Testing of Fluorescent Lamp and Ballast Systems, IEEE Transactions on Industry Applications, vol. 35, No. 6, Nov./Dec. 1999.

National Lighting Product Information Program, Specifier Reports, "Dimming Electronic Ballasts," vol. 7, No. 3, Oct. 1999.

Supertex Inc., Buck-based LED Drivers Using the HV9910B, Application Note AN-H48, Dec. 28, 2007.

D. Rand et al., Issues, Models and Solutions for Triac Modulated Phase Dimming of LED Lamps, Power Electronics Specialists Conference, 2007.

Supertex Inc., HV9931 Unity Power Factor LED Lamp Driver, Application Note AN-H52, Mar. 7, 2007.

Supertex Inc., 56W Off-line LED Driver, 120VAC with PFC, 160V, 350mA Load, Dimmer Switch Compatible, DN-H05, Feb. 2007.

ST Microelectronics, Power Factor Corrector L6561, Jun. 2004.

Fairchild Semiconductor, Application Note 42047 Power Factor Correction (PFC) Basics, Rev. 0.9.0 Aug. 19, 2004.

M. Radecker et al., Application of Single-Transistor Smart-Power IC for Fluorescent Lamp Ballast, Thirty-Fourth Annual Industry Applications Conference IEEE, vol. 1, Oct. 3, 1999-Oct. 7, 1999.

M. Rico-Secades et al., Low Cost Electronic Ballast for a 36-W Fluorescent Lamp Based on a Current-Mode-Controlled Boost Inverter for a 120-V DC Bus Power Distribution, IEEE Transactions on Power Electronics, vol. 21, No. 4, Jul. 2006.

Fairchild Semiconductor, FAN4800, Low Start-up Current PFC/PWM Controller Combos, Nov. 2006.

Fairchild Semiconductor, FAN4810, Power Factor Correction Controller, Sep. 24, 2003.

Fairchild Semiconductor, FAN4822, ZVS Average Current PFC Controller, Aug. 10, 2001.

Fairchild Semiconductor, FAN7527B, Power Factor Correction Controller, 2003.

Fairchild Semiconductor, ML4821, Power Factor Controller, Jun. 19, 2001.

Freescale Semiconductor, AN1965, Design of Indirect Power Factor Correction Using 56F800/E, Jul. 2005.

International Search Report for PCT/US2008/051072, mailed Jun. 4, 2008.

Infineon, CCM-PFC Standalone Power Factor Correction (PFC) Controller in Continuous Conduction Mode (CCM), Version 2.1, Feb. 6, 2007.

International Rectifier, IRAC1150-300W Demo Board, User's Guide, Rev 3.0, Aug. 2, 2005.

International Rectifier, Application Note AN-1077,PFC Converter Design with IR1150 One Cycle Control IC, rev. 2.3, Jun. 2005.

International Rectifier, Data Sheet PD60230 revC, Feb. 5, 2007.

Lu et al., International Rectifier, Bridgeless PFC Implementation Using One Cycle Control Technique, 2005.

Linear Technology, LT1248, Power Factor Controller, Apr. 20, 2007.

ON Semiconductor, AND8123/D, Power Factor Correction Stages Operating in Critical Conduction Mode, Sep. 2003.

ON Semiconductor, MC33260, GreenLine Compact Power Factor Controller: Innovative Circuit for Cost Effective Solutions, Sep. 2005.

ON Semiconductor, NCP1605, Enhanced, High Voltage and Efficient Standby Mode, Power Factor Controller, Feb. 2007.

ON Semconductor, NCP1606, Cost Effective Power Factor Controller, Mar. 2007.
ON Semiconductor, NCP1654, Product Review, Power Factor Controller for Compact and Robust, Continuous Conduction Mode Pre-Converters, Mar. 2007.
Philips, Application Note, 90W Resonant SMPS with TEA1610 SwingChip, AN99011, 1999.
NXP, TEA1750, GreenChip III SMPS control IC Product Data Sheet, Apr. 6, 2007.
Renesas, HA16174P/FP, Power Factor Correction Controller IC, Jan. 6, 2006.
Renesas Technology Releases Industry's First Critical-Conduction-Mode Power Factor Correction Control IC Implementing Interleaved Operation, Dec. 18, 2006.
Renesas, Application Note R2A20111 EVB, PFC Control IC R2A20111 Evaluation Board, Feb. 2007.
STMicroelectronics, L6563, Advanced Transition-Mode PFC Controller, Mar. 2007.
Texas Instruments, Application Note SLUA321, Startup Current Transient of the Leading Edge Triggered PFC Controllers, Jul. 2004.
Texas Instruments, Application Report, SLUA309A, Avoiding Audible Noise at Light Loads when using Leading Edge Triggered PFC Converters, Sep. 2004.
Texas Instruments, Application Report SLUA369B, 350-W, Two-Phase Interleaved PFC Pre-Regulator Design Review, Mar. 2007.
Unitrode, High Power-Factor Preregulator, Oct. 1994.
Texas Instruments, Transition Mode PFC Controller, SLUS515D, Jul. 2005.
Unitrode Products From Texas Instruments, Programmable Output Power Factor Preregulator, Dec. 2004.
Unitrode Products From Texas Instruments, High Performance Power Factor Preregulator, Oct. 2005.
Texas Instruments, UCC3817 BiCMOS Power Factor Preregulator Evaluation Board User's Guide, Nov. 2002.
Unitrode, L. Balogh, Design Note UC3854A/B and UC3855A/B Provide Power Limiting with Sinusoidal Input Current for PFC Front Ends, SLUA196A, Nov. 2001.
A. Silva De Morais et al., A High Power Factor Ballast Using a Single Switch with Both Power Stages Integrated, IEEE Transactions on Power Electronics, vol. 21, No. 2, Mar. 2006.
M. Ponce et al., High-Efficient Integrated Electronic Ballast for Compact Fluorescent Lamps, IEEE Transactions on Power Electronics, vol. 21, No. 2, Mar. 2006.
A. R. Seidel et al., A Practical Comparison Among High-Power-Factor Electronic Ballasts with Similar Ideas, IEEE Transactions on Industry Applications, vol. 41, No. 6, Nov.-Dec. 2005.
F. T. Wakabayashi et al., An Improved Design Procedure for LCC Resonant Filter of Dimmable Electronic Ballasts for Fluorescent Lamps, Based on Lamp Model, IEEE Transactions on Power Electronics, vol. 20, No. 2, Sep. 2005.
J. A. Vilela Jr. et al., An Electronic Ballast with High Power Factor and Low Voltage Stress, IEEE Transactions on Industry Applications, vol. 41, No. 4, Jul./Aug. 2005.
S. T.S. Lee et al., Use of Saturable Inductor to Improve the Dimming Characteristics of Frequency-Controlled Dimmable Electronic Ballasts, IEEE Transactions on Power Electronics, vol. 19, No. 6, Nov. 2004.
M. K. Kazimierczuk et al., Electronic Ballast for Fluorescent Lamps, IEEE Transactions on Power Electronics, vol. 8, No. 4, Oct. 1993.
S. Ben-Yaakov et al., Statics and Dynamics of Fluorescent Lamps Operating at High Frequency: Modeling and Simulation, IEEE Transactions on Industry Applications, vol. 38, No. 6, Nov.-Dec. 2002.
H. L. Cheng et al., A Novel Single-Stage High-Power-Factor Electronic Ballast with Symmetrical Topology, IEEE Transactions on Power Electronics, vol. 50, No. 4, Aug. 2003.
J.W.F. Dorleijn et al., Standardisation of the Static Resistances of Fluorescent Lamp Cathodes and New Data for Preheating, Industry Applications Conference, vol. 1, Oct. 13, 2002-Oct. 18, 2002.
Q. Li et al., An Analysis of the ZVS Two-Inductor Boost Converter under Variable Frequency Operation, IEEE Transactions on Power Electronics, vol. 22, No. 1, Jan. 2007.

H. Peng et al., Modeling of Quantization Effects in Digitally Controlled DC-DC Converters, IEEE Transactions on Power Electronics, vol. 22, No. 1, Jan. 2007.
G. Yao et al., Soft Switching Circuit for Interleaved Boost Converters, IEEE Transactions on Power Electronics, vol. 22, No. 1, Jan. 2007.
C. M. De Oliviera Stein et al., A ZCT Auxiliary Communication Circuit for Interleaved Boost Converters Operating in Critical Conduction Mode, IEEE Transactions on Power Electronics, vol. 17, No. 6, Nov. 2002.
W. Zhang et al., A New Duty Cycle Control Strategy for Power Factor Correction and FPGA Implementation, IEEE Transactions on Power Electronics, vol. 21, No. 6, Nov. 2006.
H. Wu et al., Single Phase Three-Level Power Factor Correction Circuit with Passive Lossless Snubber, IEEE Transactions on Power Electronics, vol. 17, No. 2, Mar. 2006.
O. Garcia et al., High Efficiency PFC Converter to Meet EN61000-3-2 and A14, Proceedings of the 2002 IEEE International Symposium on Industrial Electronics, vol. 3, 2002.
P. Lee et al., Steady-State Analysis of an Interleaved Boost Converter with Coupled Inductors, IEEE Transactions on Industrial Electronics, vol. 47, No. 4, Aug. 2000.
D.K.W. Cheng et al., A New Improved Boost Converter with Ripple Free Input Current Using Coupled Inductors, Power Electronics and Variable Speed Drives, Sep. 21-23, 1998.
B.A. Miwa et al., High Efficiency Power Factor Correction Using Interleaved Techniques, Applied Power Electronics Conference and Exposition, Seventh Annual Conference Proceedings, Feb. 23-27, 1992.
Z. Lai et al., A Family of Power-Factor-Correction Controllers, Twelfth Annual Applied Power Electronics Conference and Exposition, vol. 1, Feb. 23, 1997-Feb. 27, 1997.
L. Balogh et al., Power-Factor Correction with Interleaved Boost Converters in Continuous-Inductor-Current Mode, Eighth Annual Applied Power Electronics Conference and Exposition, 1993. APEC '93. Conference Proceedings, Mar. 7, 1993-Mar. 11, 1993.
Fairchild Semiconductor, Application Note 42030, Theory and Application of the ML4821 Average Current Mode PFC Controller, Oct. 25, 2000.
Unitrode Products From Texas Instruments, BiCMOS Power Factor Preregulator, Feb. 2006.
D. Hausman, Lutron, RTISS-TE Operation, Real-Time Illumination Stability Systems for Trailing-Edge (Reverse Phase Control) Dimmers, v. 1.0 Dec. 2004.
International Rectifier, Data Sheet No. PD60230 revC, IR1150(S)(PbF), uPFC One Cycle Control PFC IC Feb. 5, 2007.
Texas Instruments, Application Report SLUA308, UCC3817 Current Sense Transformer Evaluation, Feb. 2004.
Texas Instruments, Application Report SPRA902A, Average Current Mode Controlled Power Factor Correctiom Converter using TMS320LF2407A, Jul. 2005.
Unitrode, Design Note DN-39E, Optimizing Performance in UC3854 Power Factor Correction Applications, Nov. 1994.
Fairchild Semiconductor, Application Note 42030, Theory and Application of the ML4821 Average Currrent Mode PFC Controller, Aug. 1997.
Fairchild Semiconductor, Application Note AN4121, Design of Power Factor Correction Circuit Using FAN7527B, Rev.1.0.1, May 30, 2002.
Fairchild Semiconductor, Application Note 6004, 500W Power-Factor-Corrected (PFC) Converter Design with FAN4810, Rev. 1.0.1, Oct. 31, 2003.
Fairchild Semiconductor, FAN4822, ZVA Average Current PFC Controller, Rev. 1.0.1 Aug. 10, 2001.
Fairchild Semiconductor, ML4821, Power Factor Controller, Rev. 1.0.2, Jun. 19, 2001.
Fairchild Semiconductor, ML4812, Power Factor Controller, Rev. 1.0.4, May 31, 2001.
Linear Technology, 100 Watt LED Driver, undated.
Fairchild Semiconductor, FAN7544, Simple Ballast Controller, Rev. 1.0.0.
Fairchild Semiconductor, FAN7532, Ballast Controller, Rev. 1.0.2.
Fairchild Semiconductor, FAN7711, Ballast Control IC, Rev. 1.0.2.

Fairchild Semiconductor, KA7541, Simple Ballast Controller, Rev. 1.0.3.

ST Microelectronics, L6574, CFL/TL Ballast Driver Preheat and Dimming, Sep. 2003.

ST Microelectronics, AN993, Application Note, Electronic Ballast with PFC Using L6574 and L6561, May 2004.

International Search Report and Written Opinion for PCT/US2008/062384 dated Jan. 14, 2008.

S. Dunlap et al., Design of Delta-Sigma Modulated Switching Power Supply, Circuits & Systems, Proceedings of the 1998 IEEE International Symposium, 1998.

Response to Examination Report mailed on Feb. 25, 2011 in the corresponding UK Patent Application No. 0912435.5, as filed on Jun. 27, 2011.

Response to Examination Report mailed on Sep. 13, 2011 in the corresponding UK Patent Application No. 0912435.5, as filed on Jan. 16, 2012.

Examination Report mailed on Jan. 25, 2012 in the corresponding UK Patent Application No. 0912435.5.

An English translation of the Second Office Action mailed on Mar. 30, 2012 in the corresponding Chinese Patent Application No. 200880002403.2.

Response to Examination Report mailed on Jan. 25, 2012 in the corresponding UK Patent Application No. 0912435.5, as filed on Apr. 17, 2012.

Examination Report mailed on Sep. 13, 2011 in the corresponding UK Patent Application No. 0912435.5.

First Office Action mailed on May 20, 2011 in the corresponding Chinese Patent Application No. 200880002403.2.

Examination Report mailed on Feb. 25, 2011 in the corresponding UK Patent Application No. 0912435.5.

\* cited by examiner

MULTI-STAGE AMPLIFIER WITH MULTIPLE SETS OF FIXED AND VARIABLE VOLTAGE RAILS

CROSS-REFERENCE TO RELATED APPLICATION

This application claims the benefit under 35 U.S.C. §119 (e) and 37 C.F.R. §1.78 of U.S. Provisional Application No. 60/885,673, filed Jan. 19, 2007 and entitled "Amplifier with Fixed and Variable Supply Rails." U.S. Provisional Application No. 60/885,673 includes exemplary systems and methods and is incorporated by reference in its entirety.

BACKGROUND OF THE INVENTION

1. Field of the Invention

The present invention relates in general to the field of signal processing, and more specifically to a system and method for processing signals with a multi-stage amplifier having multiple fixed and variable voltage rails.

2. Description of the Related Art

Many electronic devices utilize one or more amplifiers to amplify an electrical signal. For example, in an audio context, a microphone utilizes transducers to convert sound waves into a corresponding electrical signal. An audio and/or video playback device reads stored data and converts the data into an electrical signal. The electrical signal often has insufficient power to drive an output device such as an audio speaker. An amplifier amplifies the smaller electrical signal to a level sufficient to drive the output device. Conventional amplifiers utilize a single set of voltage rails to supply voltage rails to a multi-stage amplifier.

FIG. 1 depicts a closed loop amplifier circuit 100. Resistors R1 and R2 provide a voltage divider for input voltage $V_{INM}$, and resistor R2 provides feedback resistance between the output and inverting terminals of operational amplifier 102. Resistors R3 and R4 provide a voltage divider circuit between input voltage $V_{INP}$ and reference voltage $V_{ref}$. Operational-amplifier 102 drives the output voltage $V_{out}$ so that the input voltages at the inverting and noninverting terminals of operational-amplifier 102 are approximately equal. A power supply supplies power to operational-amplifier 102 via voltage rails $V_{DD}$ and $V_{SS}$ to allow operational-amplifier 102 to operate.

A multi-stage amplifier includes multiple amplification stages. In at least one embodiment, operational-amplifier 102 includes multiple amplification stages. Each amplification stage utilizes power supplied by a power supply to amplify an input signal. The power supply provides a set of voltage rails, such as $V_{DD}$ and $V_{SS}$, to each amplification stage of the multi-stage amplifier. In at least one embodiment, voltage rail $V_{DD}$ represents a higher voltage with respect to voltage rail $V_{SS}$, and voltage rail $V_{SS}$ represents a negative voltage or ground.

FIG. 2, labeled prior art, depicts a signal processing system 200 with a conventional multistage amplifier 202. Signal source 208 provides analog input signal x(t), and signal source 208 can be any signal source such as a microphone or an audio and/or video device. Signal source 208 can also be any internal signal source within an integrated circuit. Amplifier 202 includes multiple, cascaded stages to successively amplify input signal x(t). Amplifier 202 generates analog output signal y(t). Amplifier stages 204 and 206 have respective gains $g_0$ and $g_1$. The overall gain of amplifier 202 is $(g_0+g_1)$, and the overall gain relates the output signal y(t) to the analog input signal x(t), i.e. $y(t)=(g_0+g_1)\cdot x(t)$. Amplifier 202 supplies output signal y(t) to an output device, such as speaker 210.

Referring to FIGS. 2 and 3, a power supply 302 provides operating power to each of amplification stages 204 and 206 by providing voltage rails $V_{DD}$ and $V_{SS}$ to power supply nodes of amplification stages 204 and 206. Amplification stage 204 includes power supply nodes $V_{DD}$ IN and $V_{SS}$ IN to receive voltage supply rails $V_{DD}$ and $V_{SS}$ from power supply 302. Amplification stage 206 includes power supply nodes $V_{DD}$ OUT and $V_{SS}$ OUT to receive voltage supply rails $V_{DD}$ and $V_{SS}$ from power supply 302. As discussed with reference to FIG. 3, although each of amplification stages 204 and 206 has a unique set of power supply nodes to receive the set of voltage rails $V_{DD}$ and $V_{SS}$, the multistage amplifier 202 is supplied by only one set of voltage rails, i.e. voltage rails $V_{DD}$ and $V_{SS}$.

FIG. 3 depicts integrated circuit 304 connected to external power supply 302. Amplifier 202 is implemented, in this embodiment, as an integrated portion of integrated circuit 304. Power supply 302 is an external device that provides power to integrated circuit 304 through pads 306 and 308. Pad 306 receives the $V_{DD}$ voltage rail of power supply 302, and pad 308 receives the $V_{SS}$ voltage rail. Each of pads 306 and 308 has two conductive paths (310, 212) and (314, 316) connected to amplifier 202. Although the power supply nodes $V_{DD}$ IN and $V_{DD}$ OUT are distinctly labeled for purposes of identifying a specific path to amplifier 202, voltage rails $V_{DD}$ IN and $V_{DD}$ OUT are actually identical to each other. Likewise, although power supply nodes $V_{SS}$ IN and $V_{SS}$ OUT are distinctly labeled for purposes of identifying a specific path to amplifier 202, voltage rails $V_{SS}$ IN and $V_{SS}$ OUT are actually identical to each other.

Efficiency of an amplification stage, in terms of power loss, increases as a difference between an input signal voltage and voltage rail decreases. Thus, when the input signal voltage approximately equals the supplied voltage rail, the amplifier operates with a high degree of efficiency.

However, to amplify a signal, the voltage rails to amplification stage are set so that each amplification stage operates properly. In at least one embodiment, proper operation includes providing sufficient bias voltages to transistors within the amplification stage for operation in a predetermined mode, such as in a saturation mode, and providing sufficient input signal headroom. Input signal headroom represents a difference between an input signal level and a maximum input signal level that can be accommodated while still allowing the amplification stage to operate. Unless otherwise indicated, "input signal headroom" is referred to herein as "headroom".

To provide sufficient headroom during operation, the voltage supply rails are fixed at specific voltage levels. During operation, input signals swing between minimum and maximum voltage levels. Thus, the efficiency of the amplifier decreases as the input signal decreases.

SUMMARY OF THE INVENTION

In one embodiment of the present invention, a method of amplifying an input signal includes receiving an input signal with a multi-stage amplifier. The method also includes receiving a mixed set of voltage rails, wherein each amplification stage of the multi-stage amplifier receives a set of the voltage rails and at least one member of one set of the voltage rails is a variable voltage rail. The method further includes amplifying the input signal using the multi-stage amplifier to generate an amplified input signal.

In another embodiment of the present invention, a signal processing device includes a multi-stage amplifier. The amplifier includes a first amplification stage having an output node and first and second power supply nodes, wherein during operation the first and second power supply nodes of the first amplification stage are coupled to respective first and second voltage rails. The amplifier also includes a second amplification stage, coupled to the output node of the first amplification stage, having first and second power supply nodes, wherein during operation the first and second power supply nodes of the second amplification stage are respectively coupled to a variable voltage rail and to a third voltage rail, and the first voltage rail is greater than the variable voltage rail.

In a further embodiment of the invention, a method of amplifying an input signal includes receiving first and second power supply voltages with a first amplification stage of a multi-stage amplifier. The method further includes receiving third and fourth power supply voltages with a second amplification stage of the multi-stage amplifier, wherein the first power supply voltage is greater than the third power supply voltage, the third power supply voltage varies over time during operation of the multi-stage amplifier and the first and third power supply voltages are more positive than respective second and fourth power supply voltages. The method also includes receiving an input signal with the multi-stage amplifier and amplifying the input signal using the multi-stage amplifier to generate an amplified input signal.

In a further embodiment of the invention, a signal processing system includes a first amplification stage, wherein during operation the first amplification stage receives a fixed supply voltage and a first variable supply voltage, and the fixed supply voltage is greater than the first variable supply voltage. The system also includes a second amplification stage, coupled to an output of the first amplification stage, wherein during operation the second amplification stage receives the fixed supply voltage and the variable supply voltage. The system further includes a third amplification stage, coupled to an output of the second amplification stage, wherein during operation the third amplification stage receives a second variable supply voltage and the first variable supply voltage, wherein the fixed supply voltage is greater than a maximum second variable supply voltage.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A signal processing system and method utilizes a multi-stage amplifier to amplify an input signal. The multi-stage amplifier uses a mixed set of voltage rails to improve the operating efficiency of at least one of the amplification stages while allowing other amplification stages to operate in a predetermined operating mode. Efficiency of at least one of the stages is improved by providing a different set of the amplifier stages is improved by utilizing at least one variable voltage rail supplied to an amplification stage of the multi-stage amplifier. The variable voltage rail varies in response to changes in an input signal voltage to the amplification stage. For amplifier stages having different voltage supply requirements, the multi-stage amplifier operates with mixed sets of voltage supply rails to allow amplification stage efficiency and provide adequate voltage to allow operation of all amplification stages. Accordingly, at least one amplification stage utilizes a variable voltage rail, and all amplification stages are supplied with a set of voltage rails that provides sufficient input signal headroom.

In at least one embodiment, the multi-stage amplifier includes at least first and second amplification stages. The two amplification stages have different supply voltage requirements. During operation of the multi-stage amplifier, the signal processing system and method provide a first set of voltage rails, which can be variable or fixed, to the first amplification stage and at least one variable voltage rail to the second amplification stage. Thus, the multi-stage amplifier can operate more efficiently than a conventional multi-stage amplifier with a fixed set of voltage rails for each amplification stage and still maintain sufficient input signal headroom for all amplification stages.

Commonly assigned U.S. patent application Ser. No. 11/610,498, filed 13 Dec. 2006, entitled "Energy-Efficient Consumer Device Audio Power Output Stage" and U.S. patent application Ser. No. 11/611,069, filed 14 Dec. 2006, and entitled "Method and Apparatus for Controlling a Selectable Voltage Audio Power Output Stage" describe illustrative method and apparatus embodiments of providing a variable voltage rail for an audio power stage. The Cirrus Applications describe utilizing a charge pump to vary the supply voltage to an amplifier depending upon the voltage level of the input signal. In at least one embodiment, the charge pump dynamically varies the supply voltage to decrease a difference between the input signal voltage and the amplifier supply voltage, thus, increasing the efficiency of the amplifier. U.S. patent application Ser. Nos. 11/610,498 and 11/611,069 (collectively referred to herein as the "Cirrus Applications") claim priority to U.S. Provisional Application No. 60/823,036 filed on 21 Aug. 2006, and the Cirrus Applications are incorporated herein by reference in their entireties.

Figure 1:
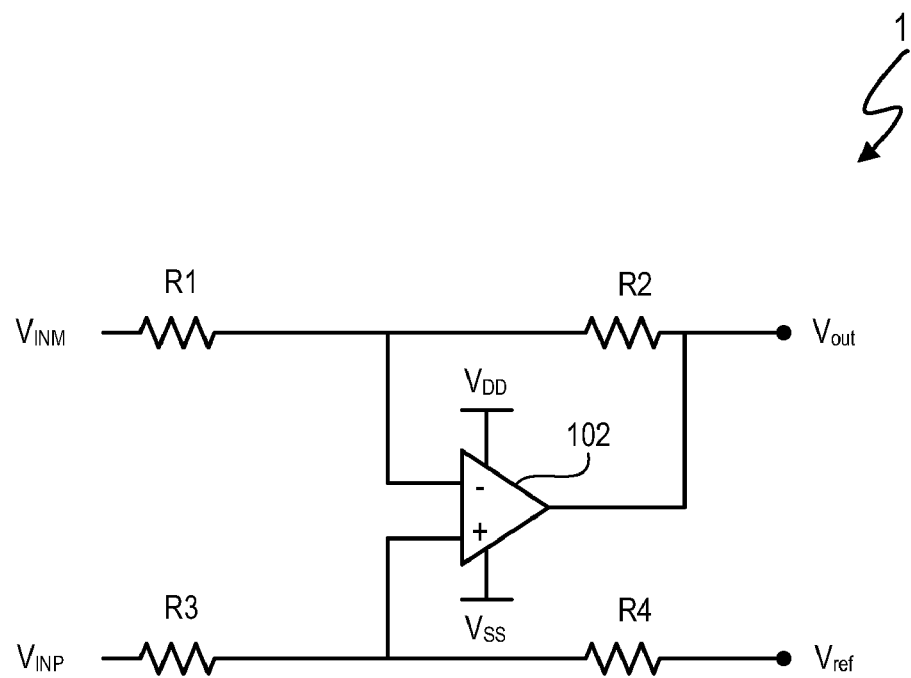
FIG. 1 (labeled prior art) depicts a closed amplifier circuit.
Figure 2:
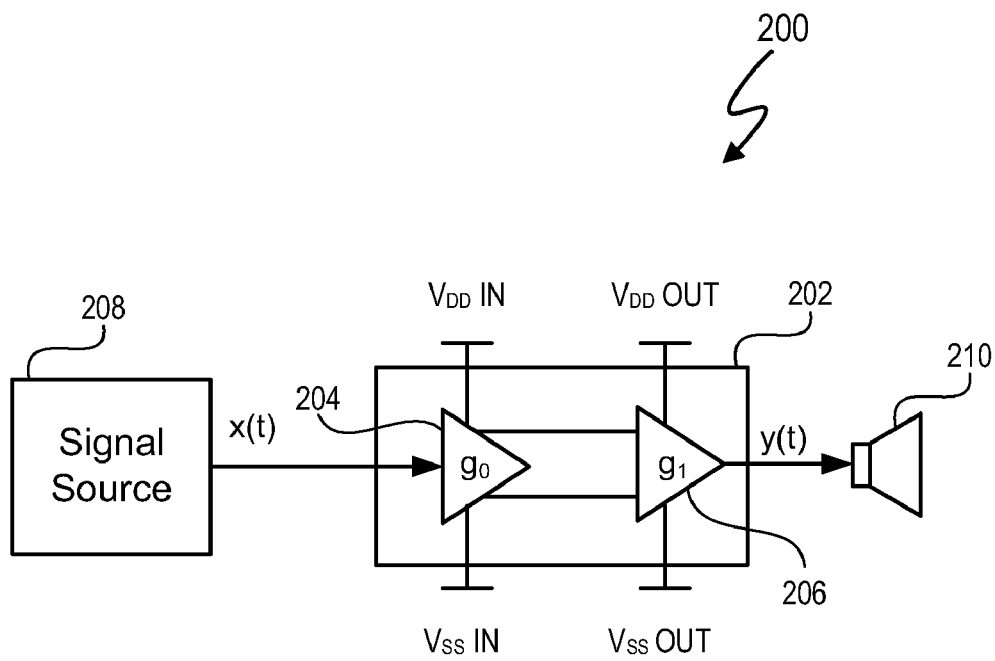
FIG. 2 (labeled prior art) depicts a multi-stage amplifier.
Figure 3:
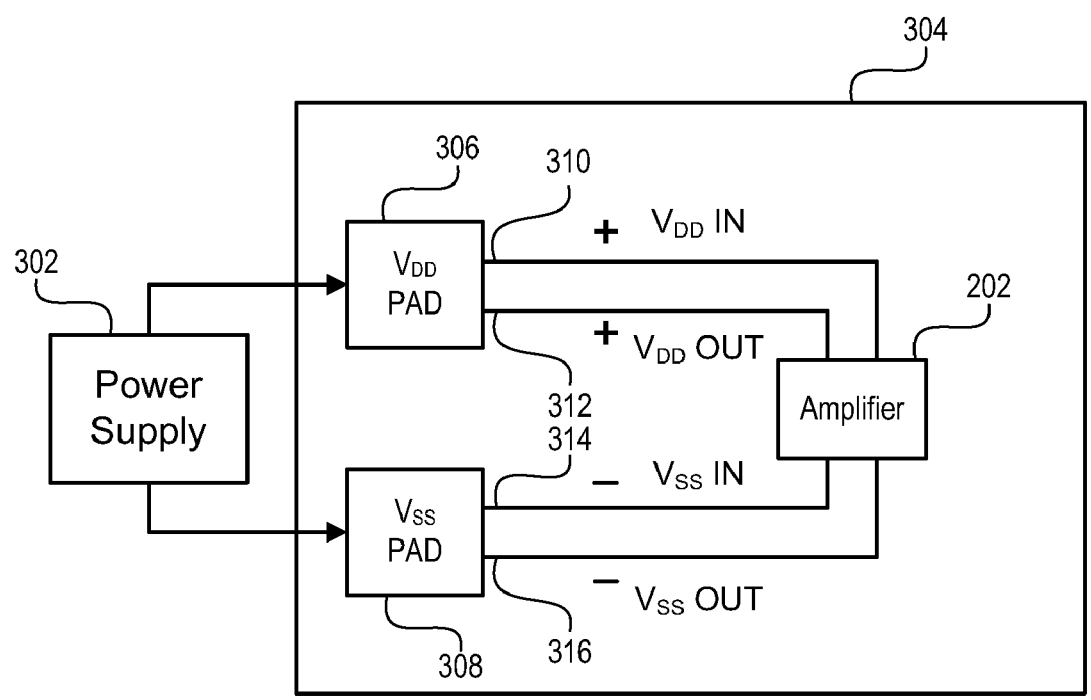
FIG. 3 (labeled prior art) depicts an integrated circuit with a multi-stage amplifier connected to an external power supply.
Figure 4:
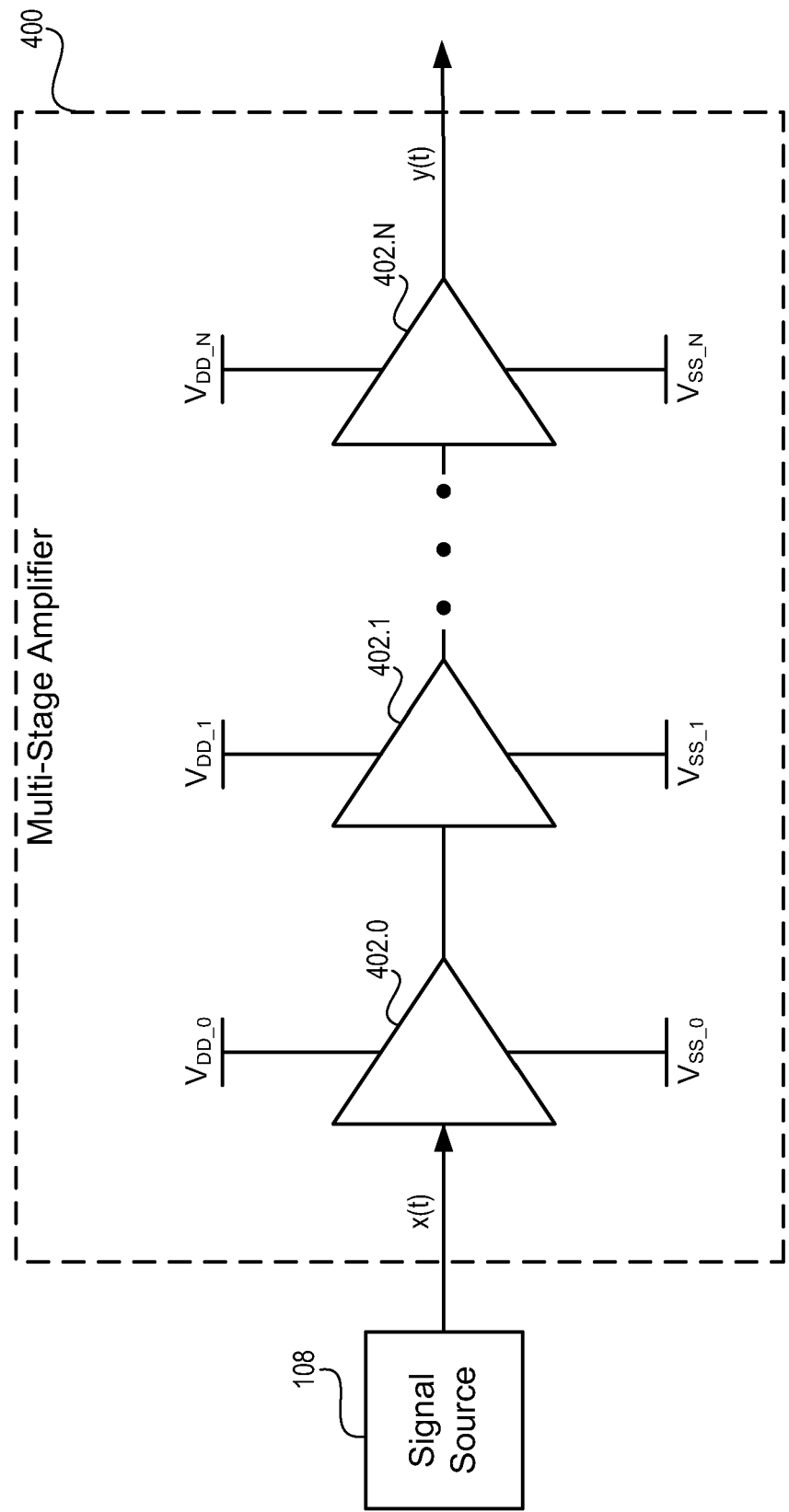
FIG. 4 depicts a multi-stage amplifier having a mixed set of voltage rails.

FIG. 4 depicts a multi-stage amplifier 400 to amplify analog input signal x(t) and generate analog output signal y(t) using multiple sets of voltage rails. The multi-stage amplifier 400 has N+1 serially connected amplification stages 402.0, 402.1, ..., 402.N, where N is an integer greater than or equal to two. Each of the amplification stages 402.0, 402.1, ..., 402.N receives two respective sets of voltage rails, $\{V_{DD\_0}, V_{SS\_0}\}, \{V_{DD\_1}, V_{SS\_1}\}, \ldots, \{V_{DD\_N}, V_{SS\_N}\}$. In at least one embodiment, the values of each set of voltage rails is set to provide sufficient headroom for the voltage swing of each input signal to each amplification stage. Particular values of the voltage rails depend upon the actual configuration of each of amplification stages 402.0, 402.1, ..., 402.N and the full swing of each input signal to each amplification stage. In at least one embodiment, all the negative voltage rails are variable voltage rails and are all equal, i.e. $V_{SS\_0} = V_{SS\_1} = \ldots = V_{SS\_N}$. In at least one embodiment, all the positive voltage rails, except that positive voltage rail $V_{DD\_N}$ of the last amplification stage are equal and fixed, and the voltage rail $V_{DD\_N}$ N of the last amplification stage is a variable voltage rail.

In at least one embodiment, at least one set of voltage rails is provided by a variable voltage supply, such as the charge pump power supply illustratively described in the Cirrus Applications. In at least one embodiment, for each amplification stage connected to the variable voltage supply, each variable voltage rail supplied by the variable voltage supply dynamically adjusts, in response to the voltage level of an input signal to the amplification stage. The adjustment reduces a difference between the voltage of the output signal and the voltage supplied to the amplification stage while providing sufficient output signal headroom. Thus, efficiency of the amplification stage stages is improved.

Different amplification stages have different voltage supply requirements for providing sufficient headroom and operational efficiency. For the same input signal level, at least one of the amplification stages 402.0, 402.1, . . . , 402.N has a greater voltage supply requirement to provide headroom for the input signal. For example, in at least one embodiment, an analog input signal x(t) has a voltage level of $+V_{in}$. To provide sufficient headroom for the input signal x(t) and allow the transistors of amplification stage 402.0 operate in saturation mode, voltage rail $V_{DD\_0}$ equals $(+V_{in}+V_{ovh})$. "$V_{ovh}$" is an overhead voltage that allows the transistors of amplification stage 402.0 to operate in saturation mode when the voltage level of analog input signal x(t) equals $+V_{in}$. For the same analog input signal x(t), voltage rail $V_{DD\_N}$ for amplification stage 402.N equals $+V_{in}$. Thus, for analog input signal x(t) having a voltage level of $+V_{in}$ and for amplification stages 402.0 and 402.N to operate properly, $V_{DD\_0} > V_{DD\_N}$. Thus, in this example, if $V_{DD\_0} = V_{DD\_N} = +V_{in}$, amplification stage 402.0 will not operate properly. If $V_{DD\_0} = V_{DD\_N} = (+V_{in}+V_{ovh})$, amplification stage 402.N does not operate as efficiently relative to voltage rail $V_{DD\_N} = +V_{in}$.

Figure 5:
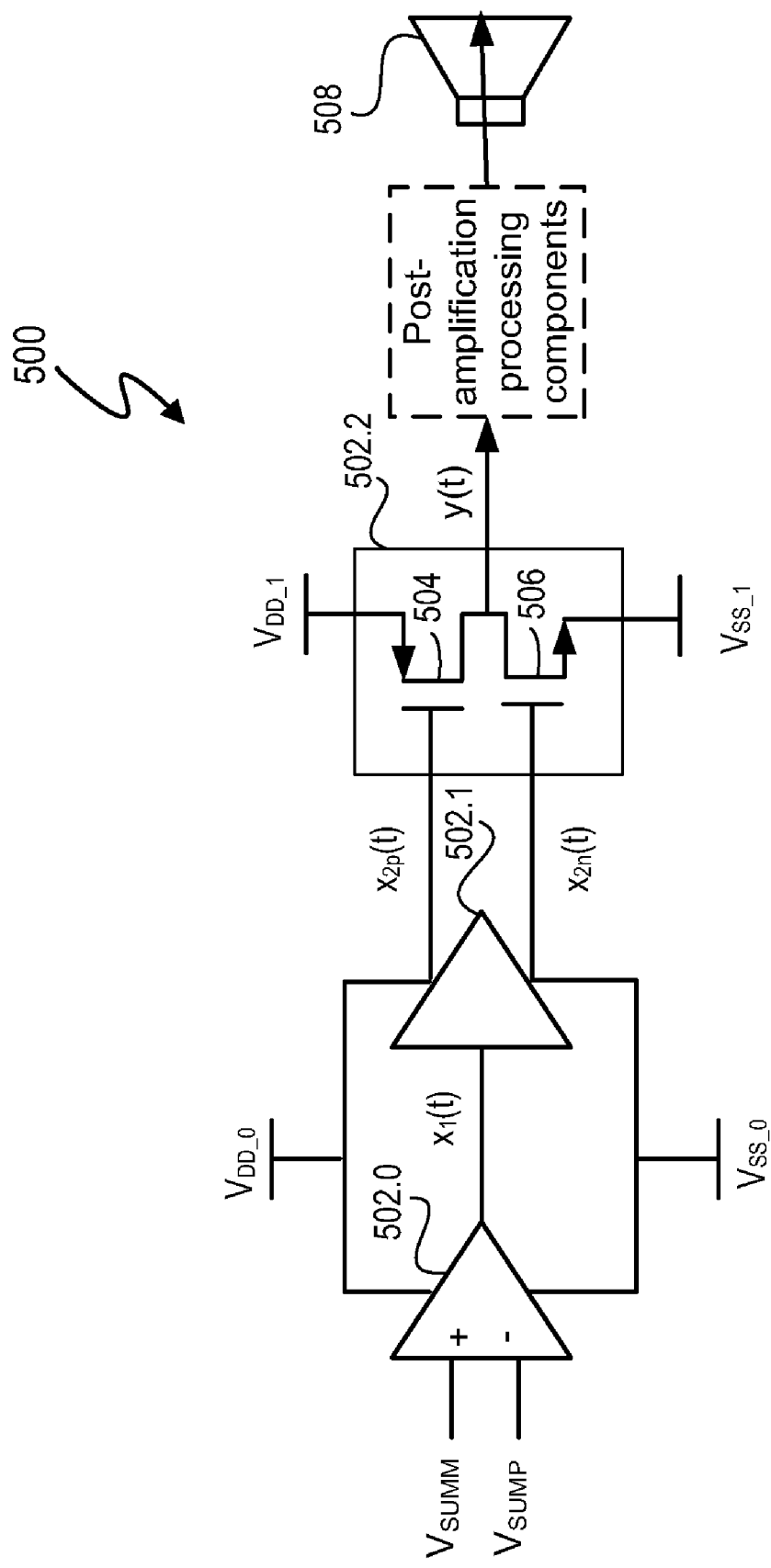
FIG. 5 depicts a multi-stage amplifier in an audio signal processing system.

FIG. 5 depicts a multi-stage amplifier 500, which is one embodiment of multi-stage amplifier 400. The multi-stage amplifier 500 is a class AB amplifier with a differential input amplification stage 502.0. During operation, amplification stage receives and amplifies a difference between input signals $V_{SUMM}$ and $V_{SUMP}$. Amplification stage 502.1 then amplifies the output of amplification stage 502.0, and amplification stage 502.2 amplifies the dual output of amplification stage 502.1. Amplification stage 502.1 provides dual output signals $x_{2p}(t)$ and $x_{2n}(t)$. N-channel complimentary metal oxide semiconductor (CMOS) field effect transistor (FET) 504 and p-channel CMOS FET 506 of amplification stage 502.2 both operate in saturation mode during normal operation of multi-stage amplifier 500. Respective voltage levels of input signals $x_{2p}(t)$ and $x_{2n}(t)$ determine the current through the respective FETs 504 and 506. Thus, in saturation mode, FETs 504 and 506 work together in accordance with the voltage levels of input signals $x_{2p}(t)$ and $x_{2n}(t)$ to generate an analog output signal y(t).

One or more power supplies provide voltage rails $V_{DD\_0}$, $V_{SS\_0}$, $V_{DD\_1}$, and $V_{SS\_1}$ to respective multi-stage amplifiers 502.0, 502.1, and 502.2. At least one of the voltage rails is variable. For example, in at least one embodiment, voltage rail $V_{DD\_1}$ is variable to increase the efficiency of amplification stage 502.2. In at least one embodiment, voltage rail $V_{SS\_1}$ is also variable. The first set of voltage rails, $\{V_{DD\_0}, V_{SS\_0}\}$, and the second set of voltage rails, $\{V_{DD\_1}, V_{SS\_1}\}$, form an exemplary mixed set of voltage rails because the sets are not identical, although each set may have a common member. For example, if voltage rail $V_{DD\_0} \neq V_{DD\_1}$ and $V_{SS\_0} = V_{SS\_1}$, the first and second set of voltage rails still form a mixed set of voltage rails. Voltage rails $V_{DD\_0}$, $V_{SS\_0}$, and $V_{DD\_1}$, $V_{SS\_1}$, can be respectively fixed or variable voltage rails. During operation of multi-stage amplifier 500, fixed voltage rails maintain a relatively constant voltage over time. Although fixed voltage rails can slightly vary over time due to, for example, an environmental factor such as temperature, fixed voltage rails are not responsive to any input signal to any amplification stage of multi-stage amplifier 500 and are not otherwise intentionally varied during operation of multi-stage amplifier 500.

In at least one embodiment, amplification stages 502.0 and 502.1 have different circuitry than amplification stage 502.2. In at least one embodiment, amplification stages 502.0 and 502.1 operate properly with the same voltage supply rails $V_{DD\_0}$ and $V_{SS\_0}$. To allow amplification stages 502.0 and 502.1 to operate, e.g. to amplify a signal, and provide sufficient headroom for input signals $V_{SUMM}$, $V_{SUMP}$, $x_1(t)$, $x_{2p}(t)$, and $x_{2n}(t)$ and allow amplification stage 502.2 to operate efficiently, voltage rail set $\{V_{DD\_0}, V_{SS\_0}\}$ differs from the voltage rail set $\{V_{DD\_1}, V_{SS\_1}\}$ when the input signals to respective amplification stages drops below a predetermined value. For example, in at least one embodiment, voltage rails $V_{DD\_0}$, $V_{SS\_0}$, and $V_{SS\_1}$ are fixed, and voltage rail $V_{DD\_1}$ is variable. When the input signal $x_{2p}(t)$ is below $+V_{in}$, voltage rail $V_{DD\_1}$ decreases to $+V_{in}$ while voltage rail $V_{DD\_0}$ remains at $(+V_{in})\cdot 2$. This allows all amplification stages to operate properly, e.g. amplification stage transistors operation in saturation mode, and increases the efficiency of amplification stage 502.2.

In at least one embodiment, multi-stage amplifier 500 is part of an audio signal processing system. The multi-stage amplifier 500 provides the analog output signal y(t) to speaker 508. In at least one embodiment, components 410, such as a low pass filter, post-process the analog output signal y(t) prior to reception by speaker 508.

Figure 6:
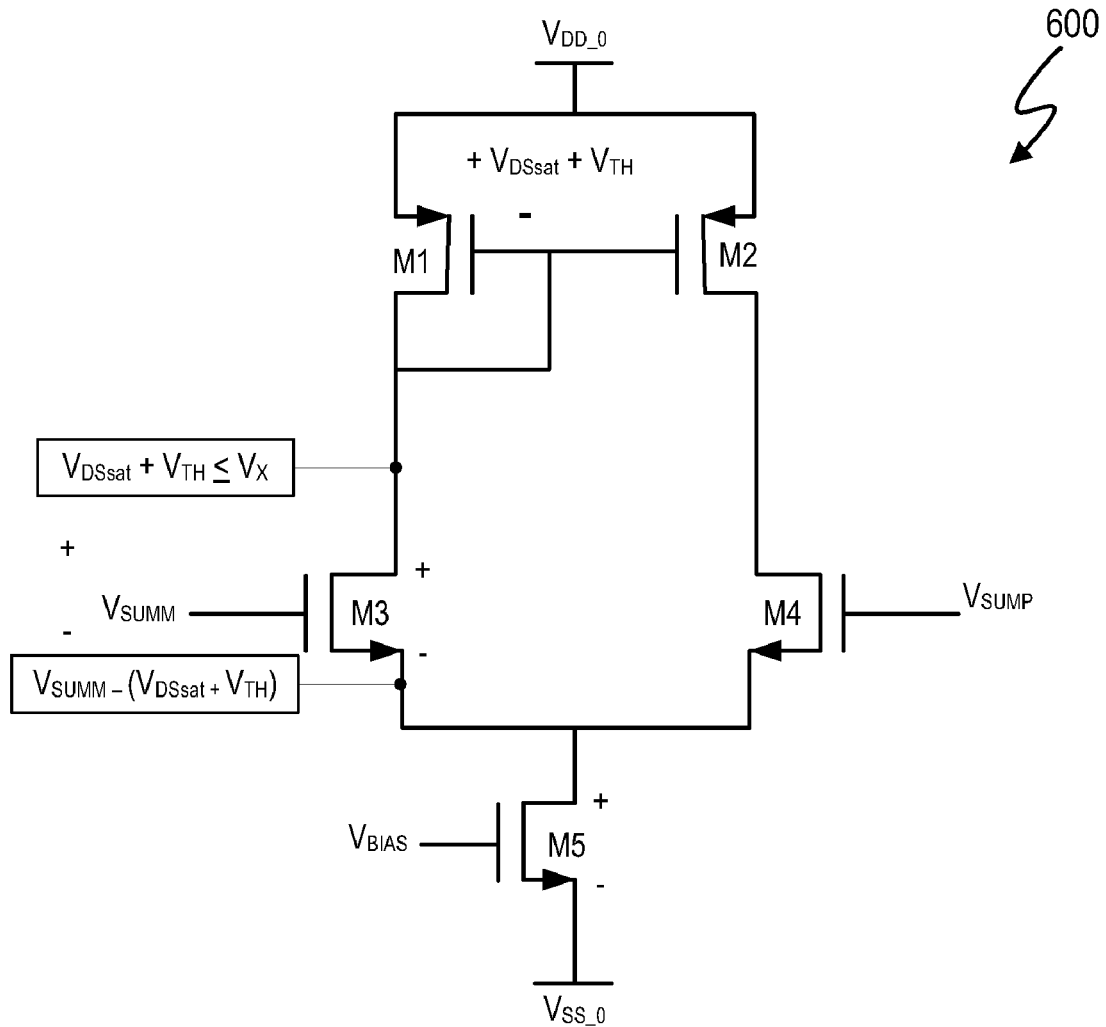
FIG. 6 depicts an amplification stage.

FIG. 6 depicts a schematic of amplification stage 600, and amplification stage 600 represents one embodiment of amplification stage 502.0. Amplification stage 600 is a differential amplifier and, thus, amplifies a difference between the differential input signals $V_{SUMM}$ and $V_{SUMP}$. A power supply provides voltage rails $V_{DD\_0}$ and $V_{SS\_0}$ to supply power to amplification stage 600. FET M1 is connected as a diode and FETs M1 and M2 have common drain and gate voltages. FETs M3 and M4, respectively connected to the sources of FETs M1 and M2, respectively receive input signals $V_{SUMM}$ and $V_{SUMP}$ as gate voltages. For proper operation, p-channel FETs M3 and M4 maintain a saturated state during operation of amplification stage 600. P-channel FET M5, connected between voltage rail $V_{SS\_1}$ and the sources of FETs M3 and M4, operates as a current source. A bias voltage $V_{BIAS}$ at the gate of FET M5 biases FET M5.

When voltage rail $V_{DD\_0}$ equals or exceeds a minimum voltage and voltage rail $V_{SS\_0}$ is below a minimum voltage, amplification stage 600 operates properly and provides sufficient headroom for the voltage swings of input signals $V_{SUMM}$ and $V_{SUMP}$. The minimum $V_{DD\_0}$ voltage rail can be determined from the schematic of amplification stage 600. During operation, the drain-gate voltage of FET M1 is $V_{DSsat}+V_{TH\_M1}$. Assuming that FETs M1, M2, M3, M4, and M5 are matched, each of FETs M1, M2, M3, M4, and M5 has the same drain-source saturation voltage $V_{DSsat}$ and the same threshold voltage $V_{TH}$. A voltage at the source of FET M3 is $V_{SUMM}-(V_{DSsat}+V_{TH})$. Voltage $V_x$ represents a voltage at the drain of FET M3. Thus:

$$V_x \geq V_{SUMM\_max} - (V_{DSsat}+V_{TH}) + V_{DSsat} \qquad [1]$$

$$V_x \geq V_{SUMM\_max} - V_{TH} \qquad [2]$$

$$V_x = V_{DD\_0} - V_{DSsat} - V_{TH} \qquad [3]$$

Substituting Equation [3] into Equation [2]:

$$V_{DD\_0} - V_{DSsat} - V_{TH} \geq V_{SUMM\_max} - V_{TH} \qquad [4]$$

To provide sufficient headroom voltage for input signal voltages $V_{SUMM}$ and $V_{SUMP}$, $V_{DD\_0} - V_{SS\_0} \geq$ headroom voltage. Thus, to provide sufficient headroom voltage:

$$V_{SUMP} \geq 2 \cdot V_{DSsat} + V_{TH} + V_{SS\_0} \quad [5]$$

rearranging Equation [5] yields:

$$V_{SS\_0} \leq V_{SUMP} - 2 \cdot V_{DSsat} - V_{TH} \quad [6]$$

$$V_{SS\_0} \leq V_{SUMP\_min} - 2 V_{DSsat} - V_{TH} \quad [7]$$

In at least one embodiment, amplification stage 600 is configured as part of an operational-amplifier with feedback to the inverting terminal, and, thus, $V_{SUMP}$ is approximately equal to $V_{SUMM}$. From Equations [4] and [7], to maintain FETs M1, M2, M3, and M4 in saturation and provide sufficient headroom for input signal $V_{SUMM}$ and $V_{SUMP}$:

$$V_{DD\_0} \geq V_{SUMM\_max} + V_{DSsat} \quad [8]$$

$$V_{SS\_0} \leq V_{SUMM\_min} - 2 V_{DSsat} - V_{TH} \quad [9]$$

The power supply requirements of at least one embodiment of amplification stages 502.0 and 502.2 can be met by providing a mixed set of voltage rails to amplification stages 502.0 and 502.2. In at least one embodiment, $V_{DSsat} = 0.100$ V, $V_{SUMMmax} = +0.9$ V, $V_{SUMMmin} = 0$ V, $V_{TH} = 0.7$ V, and $V_{SUMM} = V_{SUMP}$, from Equation [8], $V_{DD\_0}$ is greater than or equal to +1.0 V to provide sufficient headroom and allow amplification stage 600 to operate in saturation mode. From Equation [9], $V_{SS\_0}$ is less than or equal to −0.9 V to provide sufficient headroom and allow amplification stage 600 to operate in saturation mode. As discussed above with reference to FIG. 5, when input signal $x_{2p}(t)$ is +0.9 V, $V_{DD\_1}$ can be +0.9 V and still provide sufficient headroom for input signal $x_{2p}(t)$. However, from FIGS. 4 and 5, when $V_{SUMM}$ is +0.9 V, $V_{DD\_0}$ should be greater than or equal to +1.0 V. Also, in at least one embodiment, amplification stage 502.0 and 502.1 operate properly with the same voltage supply rails $V_{DD\_0}$ and $V_{SS\_0}$. Thus, by providing different voltage rails $V_{DD\_0}$ and $V_{DD\_1}$, e.g. $V_{DD\_0} = +1.0$ V and $V_{DD\_1} = +0.9$ V, amplification stages 502.0 and 502.1 can operate properly in saturation mode and provide sufficient headroom for input signal $V_{SUMM}$, and amplification stage 502.2 can operate efficiently and provide sufficient headroom for input signal $x_{2p}(t)$. Additionally, in at least one embodiment, amplification stages 502.0, 502.1, and 502.2 can utilize the same voltage rails $V_{SS\_0}$ and $V_{SS\_1}$.

Thus, the multi-stage amplifier uses a mixed set of voltage rails to improve the operating efficiency of at least one of the amplification stages while allowing other amplification stages to operate in a predetermined operating mode.

Although the present invention has been described in detail, it should be understood that various changes, substitutions and alterations can be made hereto without departing from the spirit and scope of the invention as defined by the appended claims. For example, the signal processing systems, including multi-stage amplifier 400, can be implemented using discrete, integrated, or a combination of discrete and integrated components. Additionally, the multi-stage amplifier can be used in any signal processing system including audio signal processing systems and video signal processing systems.

What is claimed is:

1. A method of amplifying an input signal, the method comprising:
   receiving an input signal with a multi-stage amplifier;
   receiving a mixed set of voltage rails, wherein each amplification stage of the multi-stage amplifier receives a set of the voltage rails and at least two of the stages of the multi-stage amplifier receive at least one variable voltage rail, wherein each variable voltage rail varies in accordance with one or more variations of an amplitude of the input signal to decrease a difference between a voltage of the input signal and voltages of the variable voltage rails;
   amplifying the input signal using the multi-stage amplifier to generate an amplified input signal; and
   utilizing a charge pump to dynamically vary the at least one variable voltage rail depending upon variations of a voltage level of the input signal.

2. The method of claim 1 wherein the set of voltage rails received by a last stage of the multi-stage amplifier comprises two variable voltage rails.

3. The method of claim 2 wherein the set of voltage rails for each of the stages of the multi-stage amplifier includes one of the variable voltage rails received by the last stage of the multi-stage amplifier and the set of voltage rails received by each of the stages of the multi-stage amplifier except the last stage also includes a fixed voltage rail.

4. The method of claim 1 wherein the input signal comprises an audio signal, the method further comprising:
   providing the amplified input signal to at least one speaker.

5. The method of claim 1 further comprising:
   for each amplification stage, generating an output signal;
   for each amplification stage, except an initial amplification stage, receiving the output signal of a preceding amplification stage; and
   receiving the variable voltage rail with one of the amplification stages, wherein the variable voltage rail received by the amplification stage varies in response to the output signal received by the amplification stage to increase efficiency of the amplification stage.

6. The method of claim 1 wherein the mixed set of voltage rails comprises fixed voltage rails and the variable voltage rail.

7. A signal processing device comprising:
   a multi-stage amplifier, the amplifier comprising:
      a first amplification stage having an output node and first and second power supply nodes, wherein during operation the first and second power supply nodes of the first amplification stage are coupled to respective first and second voltage rails, and at least one of the first and second voltage rails is a first variable voltage rail and each variable voltage rail varies in accordance with one or more variations of an amplitude of the input signal;
      a second amplification stage, coupled to the output node of the first amplification stage, having first and second power supply nodes, wherein during operation the first and second power supply nodes of the second amplification stage are respectively coupled to a second variable voltage rail and a third variable voltage rail; and
   a charge pump to dynamically vary at least one of the variable voltage rails depending upon variations of a voltage level of the input signal.

8. The signal processing system of claim 7 wherein during operation of the multi-stage amplifier, the first and second voltage rails are variable voltage rails.

9. The signal processing system of claim 7 wherein, during operation of the multi-stage amplifier, the first and the second voltage rails vary over time.

10. The signal processing system of claim 7 wherein the multi-stage amplifier further comprises:
   a third amplification stage, coupled between the first and second amplification stages, having first and second power supply nodes, wherein during operation the first and second power supply nodes of the third amplification stage are coupled respectively to the first and second voltage rails.

11. The signal processing system of claim 7 wherein the multi-stage amplifier further comprises at least one input terminal to receive an audio input signal and at least one output terminal to supply an amplified version of the audio input signal.

12. The signal processing system of claim 7 wherein the multi-stage amplifier further comprises at least one input terminal to receive an audio input signal and at least one output terminal to supply an amplified version of the audio input signal, the system further comprising:
an input source of the audio input signal coupled to the input terminal to supply the audio input signal to the multi-stage amplifier; and
at least one speaker coupled to the output terminal of the multi-stage amplifier.

13. The signal processing system of claim 7 further comprising:
a first power supply coupled to the first power supply node of the first amplification stage; and
a second power supply coupled to the second power supply node of the first amplification stage and to the first and second power supply nodes of the second amplification stage.

14. The signal processing system of claim 7 wherein the multi-stage amplifier comprises integrated circuit components.

15. A method of amplifying an input signal, the method comprising:
receiving first and second power supply voltages with a first amplification stage of a multi-stage amplifier;
receiving third and fourth power supply voltages with a second amplification stage of the multi-stage amplifier, wherein the first power supply voltage is greater than the third power supply voltage, the third and fourth power supply voltages vary over time during operation of the multi-stage amplifier and the first and third power supply voltages are more positive than respective second and fourth power supply voltages;
receiving an input signal with the multi-stage amplifier;
amplifying the input signal using the multi-stage amplifier to generate an amplified input signal; and
utilizing a charge pump to dynamically vary each of the variable voltage rails depending upon variations of a voltage level of the input signal.

16. The method of claim 15 wherein the first and second power supply voltages vary over time during operation of the multi-stage amplifier.

17. The method of claim 15 wherein the second power supply voltage and the third power supply voltage vary over time during operation of the multi-stage amplifier, and the first power supply voltage is fixed.

18. The method of claim 15 further comprising:
supplying the first and second power supply voltages to a third amplification stage of the multi-stage amplifier, wherein the third amplification stage is an intermediary amplification stage.

19. The method of claim 15 further comprising:
providing the amplified input signal to at least one speaker.

20. A signal processing system comprising:
a first amplification stage, wherein during operation the first amplification stage receives an input signal to the signal processing system and receives a fixed supply voltage and a first variable supply voltage, and the fixed supply voltage is greater than the first variable supply voltage;
a second amplification stage, coupled to an output of the first amplification stage, wherein during operation the second amplification stage receives the fixed supply voltage and the first variable supply voltage; and
a third amplification stage, coupled to an output of the second amplification stage, wherein during operation the third amplification stage receives a second variable supply voltage and the first variable supply voltage, wherein the fixed supply voltage is greater than a maximum second variable supply voltage; and
a charge pump to dynamically vary each of the variable voltage rails depending upon variations of a voltage level of the input signal.

21. The signal processing system of claim 20 further comprising:
an audio input signal generator, coupled to an input of the first amplification stage; and
at least one speaker coupled to an output of the third amplification stage.

22. The signal processing system of claim 21 further comprising:
a first power supply coupled to the first amplification stage to provide the fixed supply voltage; and
a second power supply coupled to the second and third amplification stages to provide the first and second variable supply voltages.

23. The signal processing system of claim 20 wherein the first amplification stage includes differential input nodes.

24. The method of claim 1 wherein the set of voltage rails for each of the stages of the multi-stage amplifier includes two variable voltage rails.

* * * * *